United States Patent [19]

O'Harra, II

[11] Patent Number: 4,635,265
[45] Date of Patent: Jan. 6, 1987

[54] POWER SWITCHING CIRCUIT FOR A PULSED LASER

[75] Inventor: Dale G. O'Harra, II, Belmont, Calif.

[73] Assignee: Edward Weck & Company, Inc., Research Triangle Park, N.C.

[21] Appl. No.: 620,291

[22] Filed: Jun. 13, 1984

[51] Int. Cl.$^4$ .............................................. H01S 3/09
[52] U.S. Cl. ..................... 372/25; 315/278; 372/38
[58] Field of Search .............. 372/38, 25; 307/415, 307/106; 336/155, 170; 323/248, 306, 307; 315/278

[56] References Cited

U.S. PATENT DOCUMENTS

| | | | |
|---|---|---|---|
| 3,481,340 | 6/1965 | McKnight et al. | 128/395 |
| 3,928,815 | 12/1975 | Hellwarth | 331/94.5 Q |
| 3,971,382 | 7/1976 | Krasnov | 128/303.1 |
| 3,988,662 | 10/1976 | Hunter | 323/248 |
| 4,053,845 | 10/1977 | Gould | 330/4.3 |
| 4,161,436 | 7/1979 | Gould | 204/157.1 |
| 4,262,245 | 4/1981 | Wendt | 336/155 |
| 4,409,979 | 10/1983 | Roussel et al. | 128/303.1 |

*Primary Examiner*—James W. Davie
*Attorney, Agent, or Firm*—Lawrence S. Levinson; Robert E. Lee, Jr.

[57] ABSTRACT

A power switching circuit for providing variable pulse width drive signals for a laser in response to pulsed control signals. The power switching circuit includes a transformer circuit and a power transistor output circuit. The transformer circuit comprises a first pair of primary windings coupled to input terminals through a switch and an associated pair of secondary windings coupled to the output circuit to apply switching signals thereto. The transformer circuit further includes a second pair of primary windings coupled through a resistor to the input terminals with a polarity opposite that of the first pair. Control signals having a pulse width and repetition rate associated therewith are applied to the switch. During inter pulse intervals the voltage applied to the second pair of primary windings biases the transformer into saturation in a direction opposite to that of the first pair. The transistor output circuit includes three power transistors arranged in parallel with their bases coupled to the transformer circuit secondary windings and their collectors coupled to the laser tube cathode. A clamping circuit including a diode and capacitor is coupled to the collector emitter output of the transistors in close proximity thereto to protect the transistor output circuit from the effects of line inductance when the high current laser drive signal to the cathode is suddenly terminated by the action of the power switching circuit.

8 Claims, 4 Drawing Figures

POWER SWITCHING CIRCUIT FOR A PULSED LASER

BACKGROUND OF THE INVENTION

The present invention relates to a switching circuit for a pulsed laser, more particularly, to a pulsed transformer transistorized switching arrangement.

Prior art pulsed lasers use an LC pulse forming network connected to the anode of the tube to store the energy for the laser pulse. A trigger circuit applies a triggering pulse to a coil wrapped around the laser tube which ionizes the argon gas within the tube. This provides a discharge path for the energy stored in the pulse forming network through the laser tube to the cathode causing the tube to lase. However, the laser pulse width is fixed by the LC constant of the PFN. The pulse repetition rate is controlled by the triggering pulses, but the pulse width remains fixed.

When performing perforation procedures such as iridotomies, it is desirable to provide a finite number of high power pulses with predetermined pulse widths. When performing thermal procedures such as coagulation, it is desirable to provide near CW tube operation at relatively low power levels which requires a combination of pulse width and repetition rate to control the energy being delivered. A pulse width which is fixed and optimized for perforation procedures will not in general be optimzed for coagulation procedures.

It is desirable, therefore, to provide a pulsed laser which provides laser pulses with pulse width and repetition rate which vary over a relatively wide range.

SUMMARY OF THE INVENTION

The present invention relates to a power switching circuit for providing pulsed drive signals for a laser. The circuit comprises a power transistor output circuit and a transformer circuit for providing variable pulse width switching signals to the output circuit. In the preferred embodiment the laser is air cooled and the range of pulse width variation is at least four to one with a maximum pulse width of 120 microseconds.

The transformer circuit has a first pair of primary coils coupled through a switch to input terminals and a corresponding pair of secondary coils coupled to the output circuit. The circuit further comprises a second pair of primary coils coupled through a resistor to the input terminals in opposite polarity to the first pair. A current source that is constantly supplied to the input terminals and through the resistor and second pair biases the transformer toward saturation in one direction. Control pulses are applied to the switch of the first pair of primary coils; the primary coils when activated by the control pulses overcome the weaker voltage applied to the second pair and cause a voltage pulse to be applied via the secondary coils to the output circuit. The combination of reverse bias by the second pair and use of a pair of primary and secondary windings instead of single windings results in relatively wide pulse width capability.

A resistor in parallel with each of the primary windings helps control the trailing edge of the switching signal to the output circuit. The output circuit comprises three power transistors in parallel with the base of each coupled to the secondary windings and the collector of each coupled to the cathode of the laser tube.

The three transistors are capable of delivering 150 amps or more to the cathode. To shield the output circuit from the effects of inductance in the relatively long lead between the output circuit and the cathode when the high current laser drive signal is suddenly terminated a clamping circuit is coupled to the output of the output circuit in near proximity thereto. The clamping circuit comprises a diode and small capacitor.

DETAILED DESCRIPTION OF THE DRAWINGS

Figure 1:
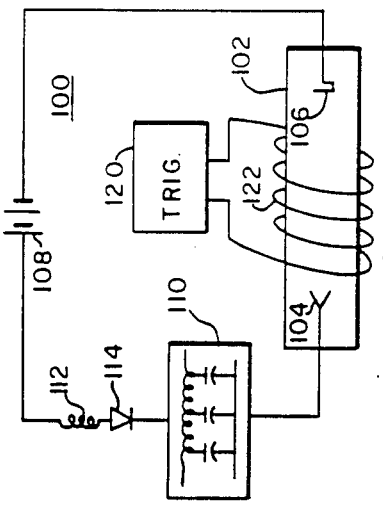
FIG. 1 is a block diagram schematic of a prior art pulsed laser.

FIG. 1 is a schematic representation of a prior art pulsed laser designated generally 100. It comprises an argon laser tube 102 having a cathode 106 and anode 104. A voltage V from voltage source 108 is applied to the cathode 106 and anode 104 through a pulse forming network (PFN) 110. An inductor 112 and diode 114 are placed in series between the voltage source 108 and one terminal of PFN 110. The laser 100 further comprises a trigger circuit 120 coupled to a wire coil 122 which surrounds tube 102. For an example of a pulsed gas laser with radiation cooling, see U.S. Pat. No. 3,626,325.

The PFN 110 is a conventional LC filter arrangement comprised of inductors and capcitors. By selecting properly the inductance, L, and the capacitance, C, the pulse width of the laser pulse can be defined. However, once the PFN 110 is designed, the pulse width becomes fixed.

The PFN 110 stores a fixed amount of energy from voltage source 108. When the trigger circuit 120 applies a voltage pulse across coil 122, the argon gas within tube 102 is ionized. The ionized gas provides a pathway through which the energy in the PFN 110 can discharge from the cathode 106 to anode 104 causing the laser to lase until the energy in the circuit is depleted. The PFN 110 begins to store energy once again but it will not discharge until the trigger circuit pulses the coil again. The pulse width of the laser output pulse is fixed and determined by the LC constant of the PFN 110 while the triggering circuit 120 determines the pulse repetition rate of the pulses. The pulse repetition rate can be varied by the triggering pulses, there being a limit on the maximum rate determined by the design of the PFN 110.

Figure 2:
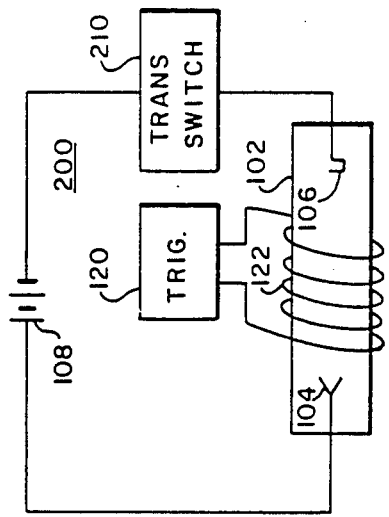
FIG. 2 is a block diagram schematic of an improved pulsed laser.

FIG. 2 is a schematic representation of a pulsed laser designated generally 200 comprising the tube 102 of FIG. 1 with cathode 106, anode 104 and voltage source 108. It further comprises a new power transistor switching circuit 210 and the trigger circuit 120 with coil 122 of FIG. 1. The power switching circuit 210 replaces the PFN 110 and inductor-diode combination 112 and 114 of FIG. 1. With the power switching circuit 210, it is possible to generate variable pulse width laser output pulses. Since the pulse repetition rate is also determined by the switching circuit 210, the trigger circuit 120 is pulsed one time to ionize the gas and thereafter remains on continuously at a lower power level in a glow mode.

There are several critical requirements that the power switching circuit 210 must meet. The first is the ability to provide a variable pulse width laser output. The range of pulse width variation is defined by the intended modes of operation of the laser. For example, it has been found that when using a pulsed laser in a perforation procedure, such as an iridotomy, a series of pulses each with a pulse width of 120 microseconds performs well. When performing a coagulation procedure, a relatively rapid pulse repetition rate with smaller pulse widths, such as 30 microsecond pulse widths, are desirable. The 30 microsecond pulse width is not as likely to cause perforation. Therefore, it is desirable to provide variable pulse widths from at least 30 microseconds to 120 microseconds. Secondly, the power switching circuit 210 must be capable of providing a large current (e.g. 100 amps) to the laser tube 102 during lasing. The current is a function of the impedance of the tube 102 and voltage across the tube, V. Typically, the impedance of the tube is four ohms resistive and the voltage is 500 volts. Finally, it is desirable to use a pulsed transformer to drive the power transistor because a transformer provides a sharp pulse termination with a negative going voltage at the pulse trailing edge.

Figure 3:
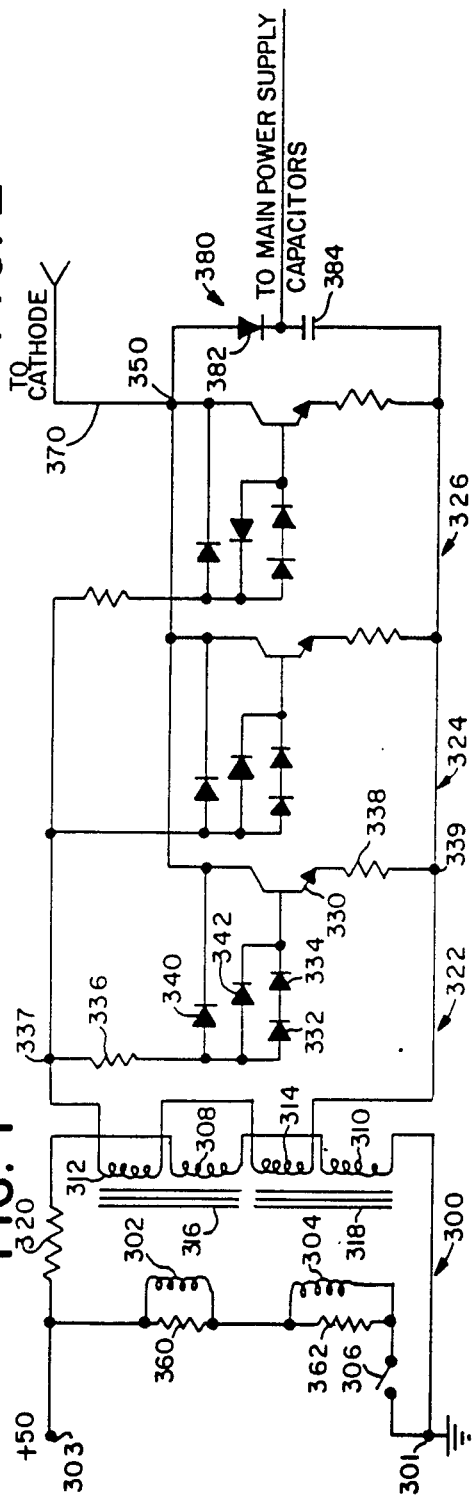
FIG. 3 is a more detailed schematic of a switching portion of the improved pulsed laser of FIG. 2.

FIG. 3 is a detailed schematic of the power switching circuit 210 of FIG. 2. The circuit 210 comprises a transformer circuit designated generally 300 comprising a first pair of primary coils 302 and 304 coupled to input terminals 301 and 303 via a switch 306; a second set of primary coils 308 and 310 wound oppositely from the first primary pair and coupled to the input terminals; a pair of secondary coils 312 and 314; and iron cores 316 and 318. The secondary coils 312 and 314 are in series and are coupled to three parallel power transistor output circuits designated generally 322, 324, and 326.

It is the function of the transformer circuit 300 to provide switching signals to the transistor circuits with a variable pulse width in response to pulsed control signals applied to switch 306. To drive the transistor circuits a 6 V 15–20 amp switching signal is required. As mentioned earlier the pulse width must be variable over at least a 30 microsecond to 120 microsecond range.

The maximum pulse width of the output from any transformer is a function of the voltage and time. A transformer that is pulsed will saturate at some fundamental limit of the transformer. For example, a pulse transformer suitable for a pulsed argon laser system will saturate at a 30 microsecond pulse width. To double the pulse width a pair of primary windings 302 and 304 and associated secondary windings 312 and 314, respectively, are used. This halves the voltage across each winding and doubles the overall pulse width to 60 microseconds before saturation occurs. It is possible to double the pulse width again to 120 microseconds by recognizing that the transformer follows a magnetic hysteresis curve. If it is repeatedly pulsed in a unipolar direction only one half the hysteresis curve is being used before the core saturates and hence the pulse width is one half of what it could be if the entire hysteresis curve were utilized. The core saturates in one direction but is never driven into saturation in the reverse direction between pulse intervals because no reverse energy is ever applied to the winding.

In the present invention, a 50 volt potential is constantly applied to the input terminals 301 and 303. While switch 306 is open the 50 volts is applied through 500 ohm resistor 320 to the second pair of primary windings 308 and 310. This biases the cores 316 and 318 into saturation into one direction. Remember the windings 308 and 310 are wound oppositely from the primary windings 302 and 304. When it is desired to apply a pulsed control signal to the transistor switching circuit 210 to pulse the laser, switch 306 is closed for the duration of the desired pulse width and the 50 volts is applied to the windings 302 and 304. Because the cores 316 and 318 were driven into saturation in one direction by windings 308 and 310, when the control pulse is applied to the switch 306 it takes twice as long to drive the cores 316 and 318 into saturation in the direction of the first pair of primary windings 302 and 304. This doubles the pulse width. Hence, a range of pulse widths from less than 30 microseconds duration up to pulse widths of 120 microseconds are possible with the arrangement of FIG. 3.

All of the transistor circuits are identical and only circuit 322 will be described in detail. Circuit 322 comprises a Motorola MJ10016 power transistor 330. The base of the transistor is coupled through a pair of diodes 332 and 334 and a 0.10 ohm resistor 336 to an output terminal 337 of the secondary winding pair 312 and 314. The emitter of the transistor 330 is coupled through a 0.02 ohm resistor 338 to the remaining output terminal 339 of the secondary winding pair. The collector is coupled to the cathode of the laser tube and also through diode 340 to the resistor 336. Finally the base is coupled along an alternate path through diode 342 to the resistor 336.

The collector diode 340 and one of the base diodes of pair 332 and 334 simulate a transistor coupled to transistor 330 to form a Darlington transistor circuit. As is well known in the art, the second transistor (in this case the power transistor 330) is kept from saturating by the action of the first transistor (in this case the diode pair 340 and either 332 or 334). This results in quicker switching action when the transistor circuit is turned off.

The base diode 342 decreases the switching time at turn off by removing stored base charge when the input pulse goes to negative.

As mentioned above, the tube 102 typically draws 100 amps, varying between 90 and 150 amps. Transistor 330 is driven with a forced current gain of approximately 10. The transformer provides a 6 V 15–20 amp base drive signal. The collectors of each of the transistors of circuits 322, 324, and 326 are combined at point 350 which is coupled to the cathode 106. The transistors are therefore able to meet the tube's current requirements.

Figure 4:
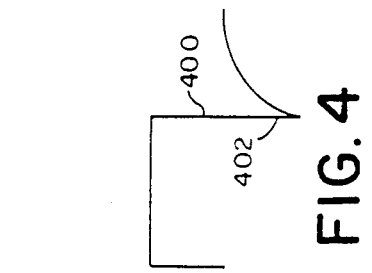
FIG. 4 is a representation of a switching signal output of a portion of the schematic of FIG. 3.

It is highly desireable in a pulsed ophthalmic laser system to have maximum control over the laser drive pulses. For example, one advantage of the pulsed transformer drive is that as the input voltage is shut off the output voltage of the transformer goes sharply negative helping to shut off the transistors. However, too deep a reverse voltage could damage the transistor and must be controlled. This is accomplished using the 75 ohm resistors 360 and 362 which are in parallel with the primary windings 302 and 304, respectively. The values of these resistors control the depth of the negative going portion 402 of the switching signal 400 shown in FIG. 4. As mentioned earlier the turn off response of the transistors is also aided by the diode 342 for removal of stored base charge.

The lead 370 running from the transistor switching circuit 210 on the circuit board to the cathode 106 of the tube has a finite length with an inductance associated therewith. When the high current flowing through the lead is suddenly terminated because the transistors are turned off so sharply, a voltage transient is created by the lead inductance. This transient is capable of damaging the power transistors in the circuits 322, 324 and 326. To remedy this a clamping circuit 380 comprising diode 382 and capaciter 384 is provided across the output of circuits 322, 324 and 326. The energy from the transient is stored in capacitor 384 which then bleeds off the energy slowly during the inter pulse intervals to the main power supply capacitors. By positioning a small capacitor (0.1 microfarad) on the transistor circuit circuit board close to the transistors, little inductance is associated with the clamping circuit itself and the transient is deflected from the transistors.

What is claimed is:

1. A power switching circuit for providing variable pulse width drive signals for a laser in response to variable pulse width control signals comprising:
   a transformer circuit for providing variable pulse width switching signals;
   a power transistor output circuit comprising transistor means coupled between the electrodes of said laser and said transformer circuit for providing said drive signals thereto in response to said switching signals, said transformer circuit further comprising:
   input terminals coupled to a power source;
   a first pair of primary windings coupled through a switch to said input terminals, said switch responsive to said variable pulse width control signals;
   a pair of secondary windings associated with said first pair of primary windings and coupled to said output circuit for providing, said variable pulse width switching signals thereto; and
   a second pair of primary windings coupled to said input terminals with a polarity opposite to that of said first pair for continuously biasing said transformer circuit toward saturation in one direction.

2. The power switching circuit of claim 1 wherein said pulsed laser is air cooled.

3. The power switching circuit of claim 1 wherein said pulse widths are variable over a range at least four to one.

4. The power switching circuit of claim 3 wherein said maximum pulse width is approximately 120 usec.

5. The transformer circuit of claim 1 wherein said circuit further comprises a resistor in parallel with each of said primary windings of said first pair for adjusting the shaper of the trailing edge of said switching signals.

6. The transistor output circuit of claim 1 wherein said output circuit further comprises a plurality of power transistors arranged in parallel with their collectors coupled to a cathode of said laser, and their bases coupled to said pair of secondary windings.

7. The transistor output circuit of claim 6 wherein said output circuit further comprises shielding means coupled across the collector-emitter output of said parallel transistors for shielding said transistors from energy reflections caused by any inductance in the anode lead of the laser.

8. The transistor output circuit of claim 7 whrein said shielding means further comprises a clamping circuit including a capacitor and diode located proximate said transistors.

* * * * *